(12) United States Patent
Lu et al.

(10) Patent No.: US 12,327,777 B2
(45) Date of Patent: Jun. 10, 2025

(54) SEMICONDUCTOR PACKAGE STRUCTURE AND MANUFACTURING METHOD THEREOF

(71) Applicant: Powerchip Semiconductor Manufacturing Corporation, Hsinchu (TW)

(72) Inventors: Chun-Lin Lu, Hsinchu (TW); Shou-Zen Chang, Hsinchu (TW); Chi-Ming Chen, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 709 days.

(21) Appl. No.: 17/691,149

(22) Filed: Mar. 10, 2022

(65) Prior Publication Data
US 2023/0230902 A1 Jul. 20, 2023

(30) Foreign Application Priority Data
Jan. 19, 2022 (TW) .................................. 111102244

(51) Int. Cl.
*H01L 23/48* (2006.01)
*H01L 23/00* (2006.01)
(Continued)

(52) U.S. Cl.
CPC ........ *H01L 23/481* (2013.01); *H01L 23/5283* (2013.01); *H01L 24/08* (2013.01);
(Continued)

(58) Field of Classification Search
CPC ................... H01L 23/481; H01L 24/08; H01L 2224/08147; H01L 2225/06548;
(Continued)

(56) References Cited

U.S. PATENT DOCUMENTS 8,493,089 B2 * 7/2013 Cordero ................. G11C 29/08
326/47
10,510,738 B2 * 12/2019 Kim ........................ H01L 24/80
(Continued)

FOREIGN PATENT DOCUMENTS

TW 200509323 3/2005
TW 201037793 10/2010
(Continued)

OTHER PUBLICATIONS

"Office Action of Taiwan Counterpart Application", issued on Apr. 13, 2023, p. 1-p. 11.

*Primary Examiner* — Mamadou L Diallo
(74) *Attorney, Agent, or Firm* — JCIPRNET

(57) ABSTRACT

A semiconductor package structure includes a control unit and a memory unit. The control unit includes a first wafer and a second wafer that are vertically stacked. The memory
(Continued)

unit is disposed on the second wafer of the control unit. The memory unit includes multiple third wafers and a fourth wafer that are stacked vertically. The memory unit overlaps the control unit in a normal direction of the semiconductor package structure. In addition, a manufacturing method of the semiconductor package structure is provided.

11 Claims, 6 Drawing Sheets

(51) Int. Cl.
  *H01L 23/528* (2006.01)
  *H01L 25/065* (2023.01)
(52) U.S. Cl.
  CPC .......... *H01L 24/80* (2013.01); *H01L 25/0657* (2013.01); *H01L 2224/08147* (2013.01); *H01L 2224/80895* (2013.01); *H01L 2224/80896* (2013.01); *H01L 2225/06544* (2013.01); *H01L 2225/06548* (2013.01); *H01L 2924/1431* (2013.01); *H01L 2924/1436* (2013.01)
(58) Field of Classification Search
  CPC ..... H01L 2225/06541; H01L 21/76898; H01L 25/0657; H01L 2924/1431; H01L 2924/1436; H01L 2225/06565; H01L 25/18; H01L 25/50
  See application file for complete search history.

(56) References Cited

U.S. PATENT DOCUMENTS

| | | | |
|---|---|---|---|
| 10,651,153 B2* | 5/2020 | Fastow | H01L 24/73 |
| 11,004,829 B2* | 5/2021 | Vodrahalli | H01L 25/50 |
| 2015/0279431 A1* | 10/2015 | Li | H01L 25/0657 |
| | | | 438/109 |
| 2017/0154655 A1* | 6/2017 | Seo | G11C 5/141 |
| 2019/0273090 A1* | 9/2019 | Fukuzumi | H01L 25/18 |
| 2020/0212027 A1 | 7/2020 | Chen et al. | |
| 2020/0365593 A1* | 11/2020 | Chen | H01L 25/50 |
| 2022/0028757 A1* | 1/2022 | Boraten | H01L 25/18 |
| 2023/0116320 A1* | 4/2023 | Felix | H01L 24/32 |
| | | | 257/686 |
| 2023/0402415 A1* | 12/2023 | Zeng | H01L 24/06 |
| 2024/0096850 A1* | 3/2024 | Pachamuthu | H01L 25/0657 |

FOREIGN PATENT DOCUMENTS

| | | |
|---|---|---|
| TW | 202101689 | 1/2021 |
| TW | 202125725 | 7/2021 |

* cited by examiner

SEMICONDUCTOR PACKAGE STRUCTURE AND MANUFACTURING METHOD THEREOF

CROSS-REFERENCE TO RELATED APPLICATION

This application claims the priority benefit of Taiwan application serial no. 111102244, filed on Jan. 19, 2022. The entirety of the above-mentioned patent application is hereby incorporated by reference herein and made a part of this specification.

BACKGROUND

Technical Field

The disclosure relates to a semiconductor package structure and a manufacturing method thereof, and more particularly, to a semiconductor package structure and a manufacturing method thereof, which may shorten a transmission path and improve work efficiency.

Description of Related Art

At present, memory chips and logic chips in a semiconductor package structure are disposed on a circuit substrate in a horizontal manner. The memory chips and the logic chips may be bonded to an interposer through a solder ball first, and then the interposer may be bonded to the circuit substrate through the solder ball. Therefore, signals between the memory chips and the logic chips are required to be transmitted through the solder ball, the interposer, and the circuit substrate.

SUMMARY

The disclosure provides a semiconductor package structure and a manufacturing method thereof, which may shorten a transmission path and improve work efficiency.

A semiconductor package structure in the disclosure includes a control unit and a memory unit. The control unit includes a first wafer and a second wafer that are vertically stacked. The memory unit is disposed on the second wafer of the control unit. The memory unit includes multiple third wafers and a fourth wafer that are vertically stacked. The memory unit overlaps the control unit in a normal direction of the semiconductor package structure.

In an embodiment of the disclosure, the first wafer includes a first bonding structure, a first substrate, a first through silicon via, and a first connecting structure. The first bonding structure includes a first bonding pad. The first substrate is disposed on the first bonding structure. The first through silicon via penetrates through the first substrate. The first connecting structure is disposed on the first substrate, and includes a multilayer first connecting pad. Two opposite ends of the first through silicon via are in direct contact with the first bonding pad and the first connecting pad of the first connecting structure adjacent to the first substrate, respectively.

In an embodiment of the disclosure, the second wafer includes a second bonding structure, a second substrate, a second interconnection layer, a second through silicon via, and a second connecting structure. The second bonding structure includes a second bonding pad. The second substrate is disposed on the second bonding structure. The second interconnection layer is disposed on the second substrate, and includes a multilayer second metallization pattern. The second through silicon via penetrates through second substrate. The second connecting structure is disposed on the second interconnection layer, and includes a second connecting pad. Two opposite ends of the second through silicon via are in direct contact with the second bonding pad and one of layers of the multilayer second metallization pattern, respectively.

In an embodiment of the disclosure, the first connecting pad of the first wafer away from the first substrate is in direct contact with the second connecting pad of the second wafer.

In an embodiment of the disclosure, the third wafer includes a third bonding structure, a third substrate, a third interconnection layer, a third through silicon via, and a third connecting structure. The third bonding structure includes a third bonding pad. The third substrate is disposed on the third bonding structure. The third interconnection layer is disposed on the third substrate, and includes a multilayer third metallization pattern. The third through silicon via penetrates through the third substrate. The third connecting structure is disposed on the third interconnection layer, and includes a third connecting pad. Two opposite ends of the third through silicon via are in direct contact with the third bonding pad and one of layers of the multilayer third metallization pattern, respectively.

In an embodiment of the disclosure, the fourth wafer includes a fourth substrate, a fourth interconnection layer, and a fourth connecting structure. The fourth interconnection layer is disposed on the fourth substrate, and includes a multilayer fourth metallization pattern. The fourth connecting structure is disposed on the fourth interconnection layer, and includes a fourth connecting pad. The third bonding pad of the third wafer away from the control unit is in direct contact with the fourth connecting pad of the fourth wafer.

In an embodiment of the disclosure, the second bonding pad of the second wafer is in direct contact with the third connecting pad of one of the third wafers.

In an embodiment of the disclosure, the first wafer is a system on chip. The second wafer is a logic chip, and the third wafers and the fourth wafer are memory chips.

A manufacturing method of a semiconductor package structure in the disclosure includes the following steps. First, a control unit is formed, and the control unit includes a first wafer and a second wafer that are vertically stacked. Next, a memory unit is formed, and the memory unit includes multiple third wafers and a fourth wafer that are vertically stacked. Then, the memory unit is bonded to the second wafer of the control unit, so that the memory unit overlaps the control unit in a normal direction of the semiconductor package structure.

In an embodiment of the disclosure, forming the control unit includes the following step. A second connecting pad of the second wafer is directly bonded to a first connecting pad of the first wafer away from a first substrate.

In an embodiment of the disclosure, forming the memory unit includes the following steps. First, a third bonding pad of one of the third wafers is directly bonded to a third connecting pad of another one of the third wafers. Next, a fourth connecting pad of the fourth wafer is directly bonded to the third bonding pad of the third wafer away from the control unit.

In an embodiment of the disclosure, the third connecting pad of one of the third wafers is directly bonded to a second bonding pad of the second wafer.

Based on the above, in the semiconductor package structure and the manufacturing method thereof according to the embodiments of the disclosure, by disposing the memory unit on the control unit in a vertically stacked manner, the transmission path between the memory unit and the control unit may be shortened. As a result, the overall work efficiency may be improved.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
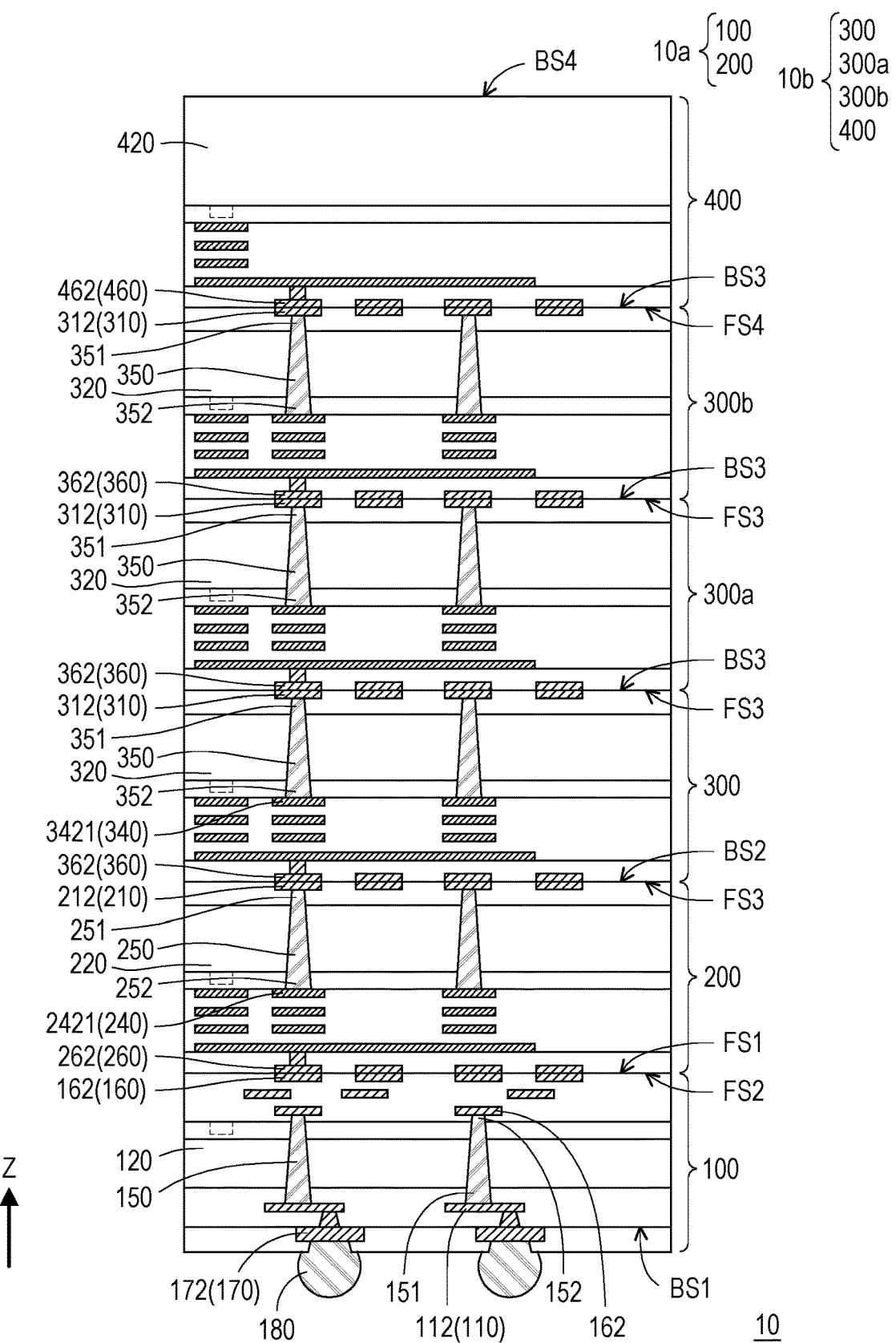
FIG. 1 is a schematic cross-sectional view of a semiconductor package structure according to an embodiment of the disclosure.
Figure 2:
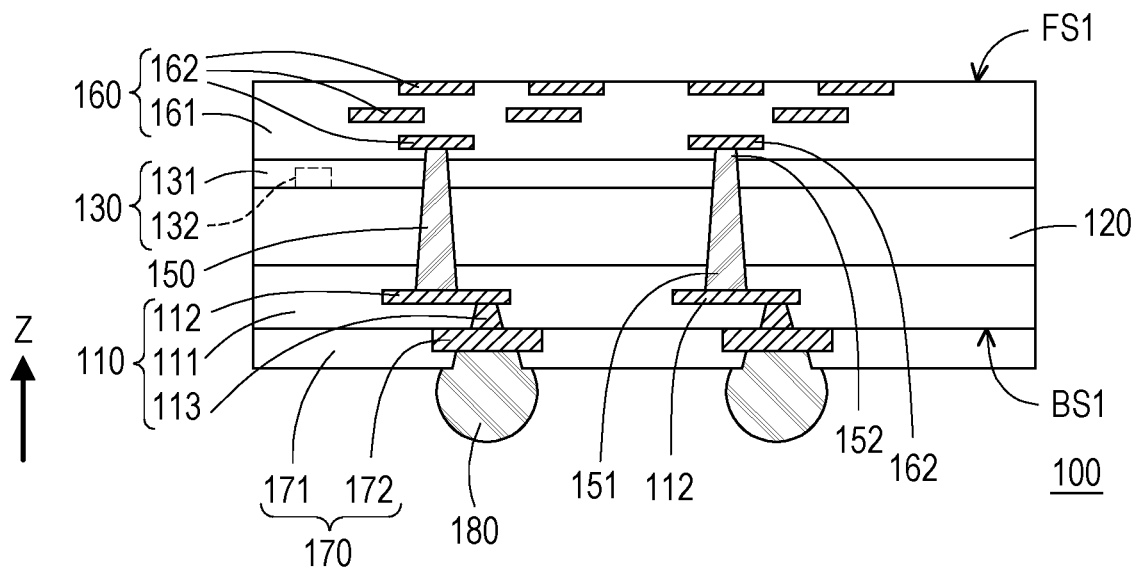
FIG. 2 is a schematic cross-sectional view of a first wafer of the semiconductor package structure of FIG. 1.
Figure 3:
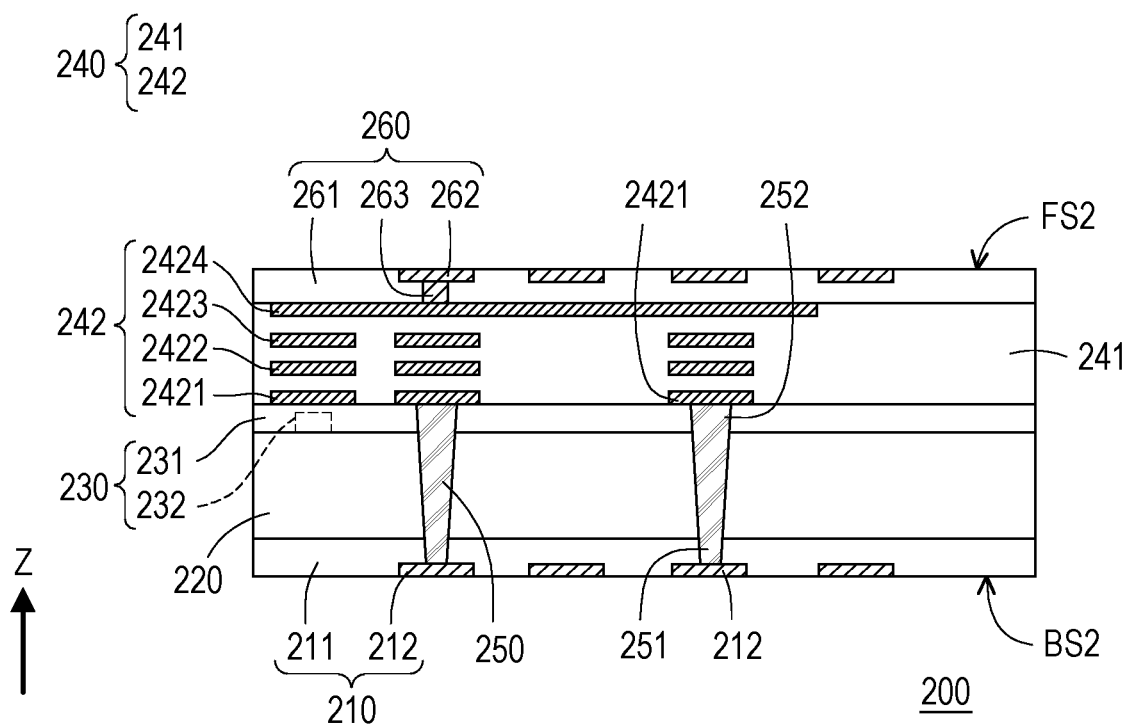
FIG. 3 is a schematic cross-sectional view of a second wafer of the semiconductor package structure of FIG. 1.
Figure 4:
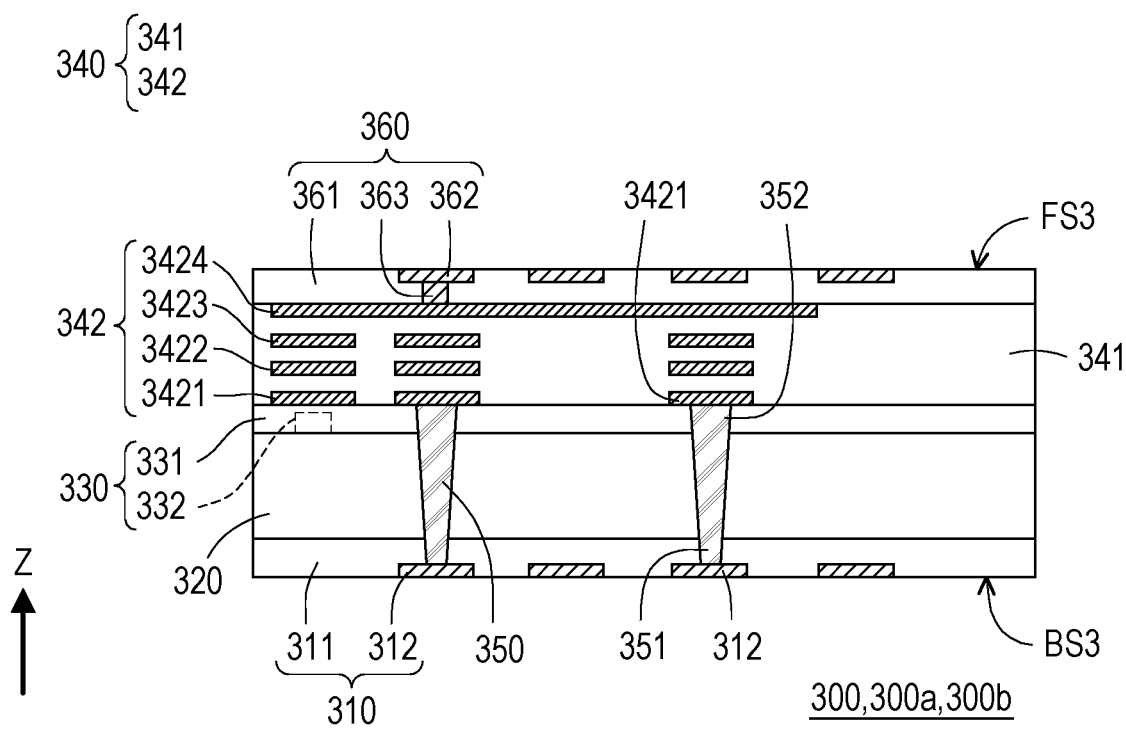
FIG. 4 is a schematic cross-sectional view of a third wafer of the semiconductor package structure of FIG. 1.
Figure 5:
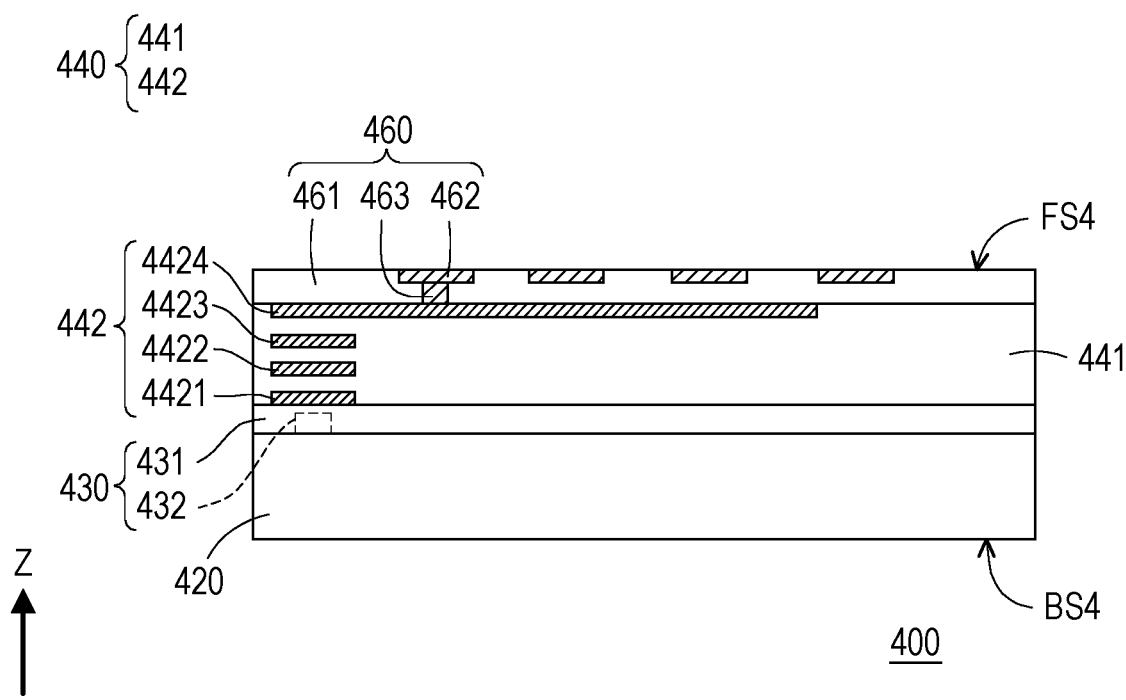
FIG. 5 is a schematic cross-sectional view of a fourth wafer of the semiconductor package structure of FIG. 1.

FIG. 1 is a schematic cross-sectional view of a semiconductor package structure according to an embodiment of the disclosure. FIG. 2 is a schematic cross-sectional view of a first wafer of the semiconductor package structure of FIG. 1. FIG. 3 is a schematic cross-sectional view of a second wafer of the semiconductor package structure of FIG. 1. FIG. 4 is a schematic cross-sectional view of a third wafer of the semiconductor package structure of FIG. 1. FIG. 5 is a schematic cross-sectional view of a fourth wafer of the semiconductor package structure of FIG. 1.

Referring to FIG. 1 first, a semiconductor package structure 10 of this embodiment includes a control unit 10a and a memory unit 10b. The control unit 10a includes a first wafer 100 and a second wafer 200 that are vertically stacked. The memory unit 10b is disposed on the second wafer 200 of the control unit 10a. The memory unit 10b includes multiple third wafers 300, 300a, and 300b (in which three are schematically shown in FIG. 1 as an example, but the disclosure is not limited thereto), and a fourth wafer 400 that are vertically stacked. The memory unit 10b overlaps the control unit 10a in a normal direction Z of the semiconductor package structure 10. In this embodiment, the semiconductor package structure 10 may be a three-dimensional multilayer stack structure, so that the control unit 10a having the multilayer wafers and the memory unit 10b having the multilayer wafers are vertically stacked and integrated together. In this embodiment, the memory unit 10b having the multilayer wafers may be a high bandwidth memory (HBM), but the disclosure is not limited thereto.

Specifically, referring to both FIGS. 1 and 2, in this embodiment, the first wafer 100 includes a first bonding structure 110, a first substrate 120, an element layer 130, a first through silicon via 150, and a first connecting structure 160. The first wafer 100 has a front side surface FS1 and a back side surface BS1 opposite to each other. The front side surface FS1 may be a surface of the first connecting structure 160 away from the first substrate 120, and the back side surface BS1 may be a surface of the first bonding structure 110 away from the first substrate 120. In this embodiment, the first wafer 100 may be a system on chip (SoC), but the disclosure is not limited thereto.

In detail, in this embodiment, the first bonding structure 110 includes a dielectric layer 111 and a first bonding pad 112. The first bonding pad 112 is disposed in the dielectric layer 111. The first substrate 120 is disposed on the first bonding structure 110. A material of the first bonding pad 112 may be, for example, copper, but the disclosure is not limited thereto. The first substrate 120 may be a silicon wafer or other suitable semiconductor wafers, but the disclosure is not limited thereto.

The element layer 130 is disposed on the first substrate 120. The element layer 130 includes a dielectric layer 131 and a semiconductor device 132. The semiconductor device 132 may include an active device and/or a passive device, such as transistors, diodes, capacitors, resistors, and inductors, etc.

The first connecting structure 160 is disposed on the first substrate 120. The first connecting structure 160 includes a dielectric layer 161 and multilayer first connecting pads 162. The multilayer first connecting pads 162 are disposed in the dielectric layer 161, and the first connecting pads 162 of the multilayer first connecting pads 162 away from the first substrate 120 are exposed to the front side surface FS1. A material of the first connecting pad 162 may be, for example, aluminum, copper, or tungsten, but the disclosure is not limited thereto.

The first through silicon via 150 may penetrate through the first substrate 120, the dielectric layer 131 of the element layer 130, a part of the dielectric layer 161 of the first connecting structure 160, and a part of the dielectric layer 111 of the first bonding structure 110. The first through silicon via 150 has two opposite ends 151 and 152. The end 151 may be in direct contact with the first bonding pad 112 of the first bonding structure 110, and the end 152 may be in direct contact with the first bonding pad 162 of the first connecting structure 160 adjacent to the first substrate 120. With this design, a signal may be directly transmitted between the first connecting pad 162 of the first connecting structure 160 adjacent to the first substrate 120 and the first bonding pad 112 of the first bonding structure 110 through the first through silicon via 150 in a vertical manner, and a redistribution layer is not required to be additionally disposed for signal transmission. As a result, a transmission path may be shortened.

In addition, in this embodiment, the first wafer 100 may further include a redistribution layer (RDL) 170 and a conductive terminal 180. The redistribution layer 170 is disposed on the back side surface BS1, and the redistribution layer 170 may include a dielectric layer 171 and a pad 172. The pad 172 is embedded in the dielectric layer 171, and may be electrically connected to the first bonding pad 112 through a conductive via 113 in the first bonding structure 110. The dielectric layer 171 has an opening to expose the pad 172. The conductive terminal 180 is disposed in the opening of the dielectric layer 171 to be electrically connected to the pad 172. The conductive terminal 180 may be configured to be bonded to a circuit board (not shown), but the disclosure is not limited thereto.

Referring to both FIGS. 1 and 3, in this embodiment, the second wafer 200 may include a second bonding structure 210, a second substrate 220, an element layer 230, a second interconnection layer 240, a second through silicon via 250, and a second connecting structure 260. The second wafer 200 has a front side surface FS2 and a back side surface BS2 opposite to each other. The front side surface FS2 may be a surface of the second connecting structure 260 away from the second substrate 220, and the backside surface BS2 may be a surface of the second bonding structure 210 away from the second substrate 220. In this embodiment, the second wafer 200 may be a logic chip, but the disclosure is not limited thereto.

In detail, in this embodiment, the second bonding structure 210 includes a dielectric layer 211 and a second bonding pad 212. The second bonding pad 212 is embedded in the dielectric layer 211 and exposed to the back side surface BS2. The second bonding pad 212 may be configured to be connected to the adjacent wafer. A material of the second bonding pad 212 may be, for example, copper, but the disclosure is not limited thereto. The second substrate 220 is disposed on the second bonding structure 210. The second substrate 220 may be a silicon wafer or other suitable semiconductor wafers, but the disclosure is not limited thereto.

The element layer 230 is disposed on the second substrate 220. The element layer 230 includes a dielectric layer 231 and a semiconductor device 232. The semiconductor device 232 may include an active device and/or a passive device, such as transistors, diodes, capacitors, resistors, and inductors, etc.

The second interconnection layer 240 is disposed on the second substrate 220 and the element layer 230. The second interconnection layer 240 includes a dielectric layer 241 and a multilayer second metallization pattern 242 (in which four layers are schematically shown in FIGS. 1 and 3 as an example, but the disclosure is not limited thereto). The multilayer second metallization pattern 242 is disposed in the dielectric layer 241, and may be electrically connected to the semiconductor device 232. The multilayer second metallization pattern 242 may be sequentially divided into a first-layer metallization pattern 2421, a second-layer metallization pattern 2422, a third-layer metallization pattern 2423, and a fourth-layer metallization pattern 2424 in a direction from the back side surface BS2 to the front side surface FS2. A material of the second metallization pattern 242 may be, for example, aluminum, copper, or tungsten, but the disclosure is not limited thereto.

The second through silicon via 250 may penetrate through the second substrate 220, the dielectric layer 231 of the element layer 230, and a part of the dielectric layer 211 of the second bonding structure 210. The second through silicon via 250 has two opposite ends 251 and 252. The end 251 may be in direct contact with the second bonding pad 212 of the second bonding structure 210, and the end 252 may be in direct contact with the first-layer metallization pattern 2421 of the multilayer second metallization pattern 242. With this design, the signal may be directly transmitted between the first-layer metallization pattern 2421 of the second interconnection layer 240 and the second bonding pad 212 of the second bonding structure 210 through the second through silicon via 250 in the vertical manner, and the redistribution layer is not required to be additionally disposed for the signal transmission. As a result, the transmission path may be shortened, and power consumption may be reduced, thereby having the effect of improving work efficiency. In some embodiments, the end 252 may also be in direct contact with other layers (e.g., the second-layer metallization pattern 2422, the third-layer metallization pattern 2423, or the fourth-layer metallization pattern 2424) of the multilayer second metallization pattern 242 according to actual design requirements, as long as the signal may be directly transmitted between the metallization pattern of the second interconnection layer 240 and the second bonding pad 212 of the second bonding structure 210 through the second through silicon via 250 to achieve the effect of shortening the transmission path.

The second connecting structure 260 is disposed on the second interconnection layer 240. The second connecting structure 260 includes a dielectric layer 261, a second connecting pad 262, and a conductive via 263. The second connecting pad 262 is embedded in the dielectric layer 261 and exposed to the front side surface FS2. The conductive via 263 penetrates through the dielectric layer 261 to be electrically connected to the second connecting pad 262 and the multilayer second metallization pattern 242.

Figure 6:
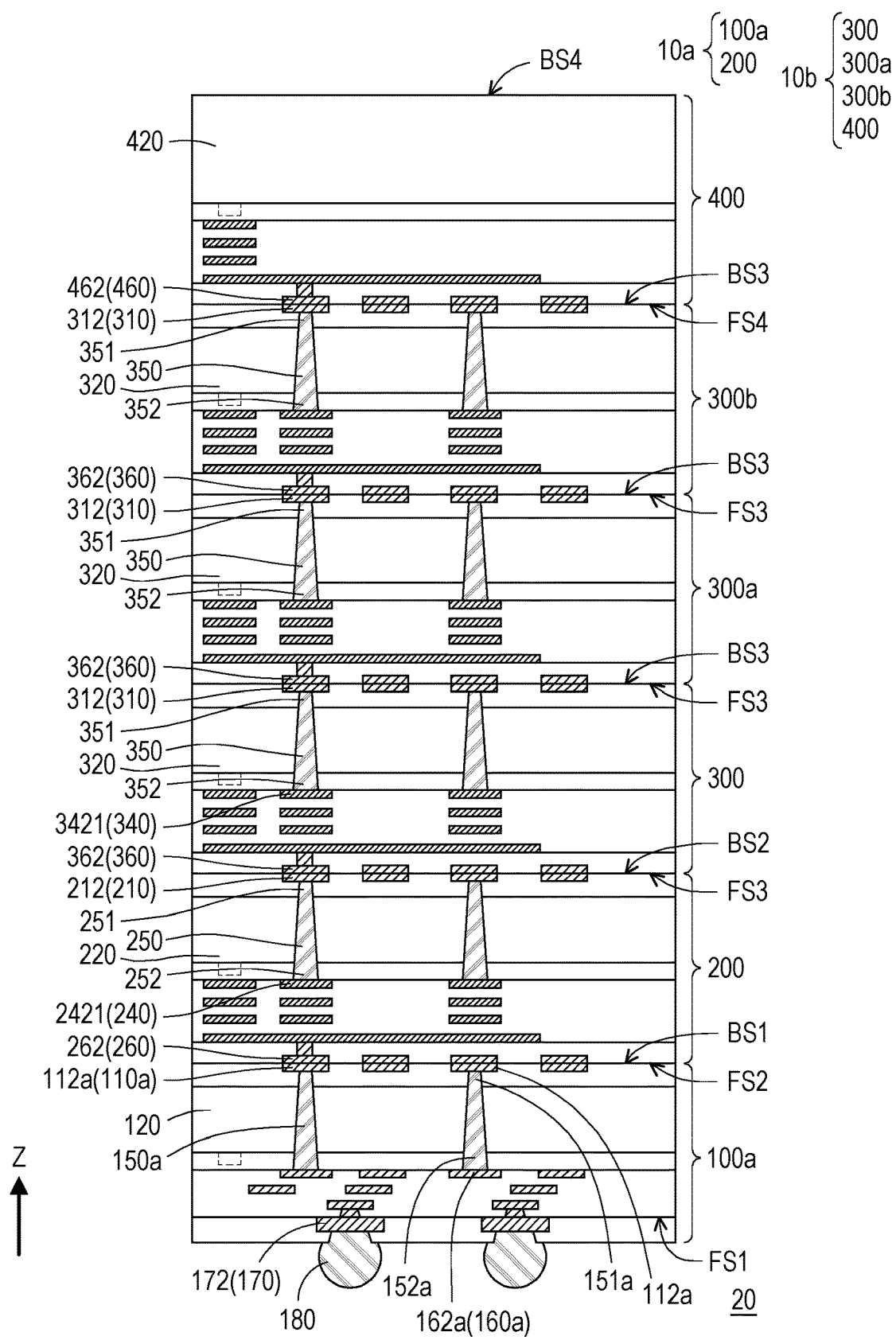
FIG. 6 is a schematic cross-sectional view of a semiconductor package structure according to another embodiment of the disclosure.

In this embodiment, the second connecting pad 262 of the second connecting structure 260 in the second wafer 200 may be in direct contact with the first connecting pad 162 of the first wafer 100 away from the first substrate 120, so as to shorten a transmission path between the second wafer 200 and the first wafer 100, and improve the work efficiency. In this embodiment, the front side surface FS2 of the second wafer 200 may face the front side surface FS1 of the first wafer 100, so that the second wafer 200 and the first wafer 100 are disposed in a face-to-face manner, but the disclosure is not limited thereto. In some embodiments, the second wafer and the first wafer may be disposed in a face-to-back manner according to the actual design requirements, as shown in FIG. 6.

Referring to both FIGS. 1 and 4, in this embodiment, the third wafers 300, 300a, and 300b may include a third bonding structure 310, a third substrate 320, an element layer 330, a third interconnection layer 340, a third through silicon via 350, and a third connecting structure 360. The third wafer 300 has a front side surface FS3 and a back side surface BS3 opposite to each other. The front side surface FS3 may be a surface of the third connecting structure 360 away from the third substrate 320, and the back side surface BS3 may be a surface of the third bonding structure 310 away from the third substrate 320. In this embodiment, the third wafers 300, 300a, and 300b may be memory chips, such as a dynamic random access memory (DRAM), but the disclosure is not limited thereto.

In detail, in this embodiment, the third bonding structure 310 includes a dielectric layer 311 and a third bonding pad 312. The third bonding pad 312 is embedded in the dielectric layer 311 and exposed to the back side surface BS3. The third bonding pad 312 may be configured to be connected to the adjacent wafer. A material of the third bonding pad 312 may be, for example, copper, but the disclosure is not limited thereto. The third substrate 320 is disposed on the third bonding structure 310. The third substrate 320 may be a silicon wafer or other suitable semiconductor wafers, but the disclosure is not limited thereto.

The element layer 330 is disposed on the third substrate 320. The element layer 330 includes a dielectric layer 331 and a semiconductor device 332. The semiconductor device 332 may include an active device and/or a passive device, such as transistors, diodes, capacitors, resistors, and inductors, etc.

The third interconnection layer 340 is disposed on the third substrate 320 and the element layer 330. The third interconnection layer 340 includes a dielectric layer 341 and a multilayer third metallization pattern 342 (in which four layers are schematically shown in FIGS. 1 and 4 as an example, but the disclosure is not limited thereto). The multilayer third metallization pattern 342 is disposed in the dielectric layer 341, and may be electrically connected to the semiconductor device 332. The multilayer third metallization pattern 342 may be sequentially divided into a first-layer metallization pattern 3421, a second-layer metallization pattern 3422, a third-layer metallization pattern 3423, and a fourth-layer metallization pattern 3424 in a direction from the back side surface BS3 to the front side surface FS3. A material of the third metallization pattern 342 may be, for example, aluminum, copper, or tungsten, but the disclosure is not limited thereto.

The third through silicon via 350 may penetrate through the third substrate 320, the dielectric layer 341 of the third interconnection layer 340, and a part of the dielectric layer 311 of the third bonding structure 310. The third through silicon via 350 has two opposite ends 351 and 352. The end 351 may be in direct contact with the third bonding pad 312 of the third bonding structure 310, and the end 352 may be in direct contact with the first-layer metallization pattern 3421 of the multilayer third metallization pattern 342. With this design, the signal may be directly transmitted between the first-layer metallization pattern 3421 of the third interconnection layer 340 and the third bonding pad 312 of the third bonding structure 310 through the third through silicon via 350 in the vertical manner, and the redistribution layer is not required to be additionally disposed for the signal transmission. As a result, the transmission path may be shortened, and the power consumption may be reduced, thereby having the effect of improving the work efficiency. In some embodiments, the end 352 may also be in direct contact with other layers (e.g., the second-layer metallization pattern 3422, the third-layer metallization pattern 3423, or the fourth-layer metallization pattern 3424) of the multilayer third metallization pattern 342 according to the actual design requirements, as long as the signal may be directly transmitted between the metallization pattern of the third interconnection layer 340 and the third bonding pad 312 of the third bonding structure 310 through the third through silicon via 350 to achieve the effect of shortening the transmission path.

The third connecting structure 360 is disposed on the third interconnection layer 340. The third connecting structure 360 includes a dielectric layer 361, a third connecting pad 362, and a conductive via 363. The third connecting pad 362 is embedded in the dielectric layer 361 and exposed to the front side surface FS3. The conductive via 363 penetrates through the dielectric layer 361 to be electrically connected to the third connecting pad 362 and the multilayer third metallization pattern 342.

In this embodiment, the third wafer 300, the third wafer 300a, and the third wafer 300b are sequentially stacked on the second wafer 200 in the normal direction Z of the semiconductor package structure 10. The third bonding pad 312 of the third wafer 300 may be in direct contact with the third connecting pad 362 of the third wafer 300a, and the third bonding pad 312 of the third wafer 300a may be in direct contact with the third connecting pad 362 of the third wafer 300b, so as to shorten transmission paths between the third wafer 300 and the third wafer 300a and between the third wafer 300a and the third wafer 300b, and improve the work efficiency. In this embodiment, the front side surface FS3 of the third wafer 300a may face the back side surface BS3 of the third wafer 300, and the front side surface FS3 of the third wafer 300b may face the back side surface BS3 of the third wafer 300a, so that the third wafer 300a and the third wafer 300 are disposed in the face-to-back manner, and the third wafer 300b and the third wafer 300a are also disposed in the face-to-back manner.

In addition, in this embodiment, the third connecting pad 362 of the third wafer 300 may be in direct contact with the second bonding pad 212 of the second wafer 200, so as to shorten a transmission path between the third wafer 300 and the second wafer 200, and improve the work efficiency. In this embodiment, the front side surface FS3 of the third wafer 300 may face the back side surface BS2 of the second wafer 200, so that the third wafer 300 and the second wafer 200 are disposed in the face-to-back manner.

Referring to both FIGS. 1 and 5, in this embodiment, the fourth wafer 400 includes a fourth substrate 420, an element layer 430, a fourth interconnection layer 440, and a fourth connecting structure 460. The fourth wafer 400 has a front side surface FS4 and a back side surface BS4 opposite to each other. The front side surface FS4 may be a surface of the fourth connecting structure 460 away from the fourth interconnection layer 440, and the back side surface BS4 may be a surface of the fourth substrate 420 away from the fourth interconnection layer 440. In this embodiment, the fourth wafer 400 may be a memory chip, such as a dynamic random access memory, but the disclosure is not limited thereto.

In detail, in this embodiment, the fourth substrate 420 may be a silicon wafer or other suitable semiconductor wafers, but the disclosure is not limited thereto. The element layer 430 is disposed on the fourth substrate 420. The element layer 430 includes a dielectric layer 431 and a semiconductor device 432. The semiconductor device 432 may include an active device and/or a passive device, such as transistors, diodes, capacitors, resistors, and inductors, etc.

The fourth interconnection layer 440 is disposed on the fourth substrate 420 and the element layer 430. The fourth interconnection layer 440 includes a dielectric layer 441 and a multilayer fourth metallization pattern 442 (in which four layers are schematically shown in FIGS. 1 and 5 as an example, but the disclosure is not limited thereto). The fourth metallization pattern 442 is disposed in the dielectric layer 441, and may be electrically connected to the semiconductor device 432. The fourth metallization pattern 442 may be sequentially divided into a first-layer metallization pattern 4421, a second-layer metallization pattern 4422, a third-layer metallization pattern 4423, and a fourth-layer metallization pattern 4424 in a direction from the back side surface BS4 to the front side surface FS4. A material of the fourth metallization pattern 442 may be, for example, aluminum, copper, or tungsten, but the disclosure is not limited thereto.

The fourth connecting structure 460 is disposed on the fourth interconnection layer 440. The fourth connecting structure 460 includes a dielectric layer 461, a fourth connecting pad 462, and a conductive via 463. The fourth connecting pad 462 is embedded in the dielectric layer 461 and exposed to the front side surface FS4. The conductive via 463 penetrates through the dielectric layer 461 to be electrically connected to the fourth connecting pad 462 and the multilayer fourth metallization pattern 442.

In this embodiment, the fourth connecting pad 462 of the fourth connecting structure 460 in the fourth wafer 400 may be in direct contact with the third bonding pad 312 of the third bonding structure 310 in the third wafer 300b, so as to shorten a transmission path between the fourth wafer 400 and the third wafer 300b, and improve the work efficiency.

In this embodiment, the front side surface FS4 of the fourth wafer 400 may face the back side surface BS3 of the third wafer 300b, so that the fourth wafer 400 and the third wafer 300b are disposed in the face-to-back manner.

In this embodiment, a manufacturing method of the semiconductor package structure 10 includes, but is not limited to, the following steps. First, the second connecting pad 262 of the second wafer 200 is directly bonded to the first connecting pads 162 of the first wafer 100 away from the first substrate 120 by hybrid bonding, so as to form the control unit 10a. Next, the third connecting pad 362 of the third wafer 300a is directly bonded to the third bonding pad 312 of the third wafer 300 by hybrid bonding; the third connecting pad 362 of the third wafer 300b is directly bonded to the third bonding pad 312 of the third wafer 300a by hybrid bonding, and the fourth connecting pad 462 of the fourth wafer 400 is directly bonded to the third bonding pad 312 of the third wafer 300b by hybrid bonding, so as to form the memory unit 10b. Then, the third connecting pad 362 of the third wafer 300 is directly bonded to the second bonding pad 212 of the second wafer 200 by hybrid bonding, so that the memory unit 10b is directly bonded to the second wafer 200 of the control unit 10a, and the memory unit 10b may overlap the control unit 10a in the normal direction Z of the semiconductor package structure 10. So far, the semiconductor package structure 10 of this embodiment has been substantially manufactured.

In addition, in this embodiment, the second through silicon via 250 of the second wafer 200 is manufactured by a process method of via middle. That is to say, the second through silicon via 250 is formed after the element layer 230 is formed and before the second interconnection layer 240 is formed. At this time, a shape of the third through silicon via 350 may be, for example, an inverted trapezoid, as shown in FIG. 3. In some embodiments, the second through silicon via of the second wafer may also be manufactured by a process method of via last. That is to say, the second through silicon via is formed after the element layer and the second interconnection layer are formed. At this time, the shape of the third through silicon via may be, for example, a normal trapezoid (not shown).

In this embodiment, the third through silicon via 350 of the third wafers 300, 300a, and 300b is manufactured by the process method of via middle. That is to say, the third through silicon via 350 is formed after the element layer 330 is formed and before the third interconnection layer 340 is formed. At this time, the shape of the third through silicon via 350 may be, for example, the inverted trapezoid, as shown in FIG. 3.

Figure 9:
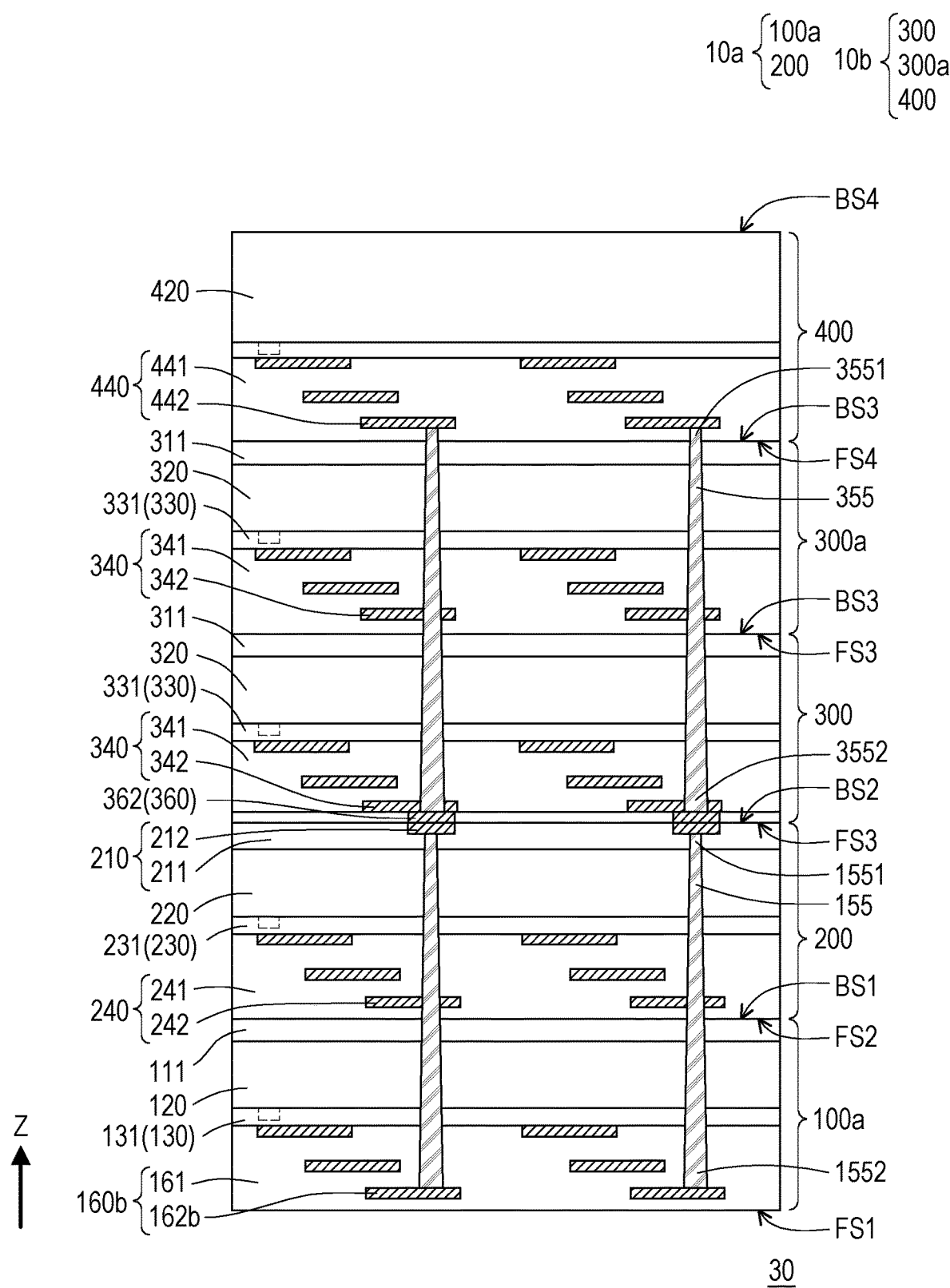
FIG. 9 is a schematic cross-sectional view of a semiconductor package structure according to another embodiment of the disclosure.

In this embodiment, the first wafer 100 and the second wafer 200 in the control unit 10a may shorten the transmission path through the first through silicon via 150 and the second through silicon via 250 respectively, and the third wafer 300, the third wafer 300a, and the third wafer 300b in the memory unit 10b may shorten the transmission path through the respective third through silicon vias 350. However, the disclosure is not limited thereto. In some embodiments, the first through silicon via 150 and the second through silicon via 250 may be replaced by a through silicon via penetrating through the first wafer 100 and the second wafer 200, so as to shorten a transmission path of the control unit 10a, as shown in FIG. 9. In some embodiments, the respective third through silicon vias 350 may be replaced by another through silicon via penetrating through the third wafer 300, the third wafer 300a, and the third wafer 300b, so as to shorten a transmission path of the memory unit 10b, as shown in FIG. 9.

In this embodiment, the two adjacent wafers may be in direct contact and bonded in the vertical manner by hybrid bonding. Therefore, it is possible to avoid increasing the transmission path and increasing the resistance due to the use of bumps or solder balls for bonding, so as to shorten the transmission path and reduce the power consumption, thereby improving the work efficiency and reducing the overall size.

In this embodiment, the stacking of wafers to wafers is used to illustrate that hybrid bonding and the through silicon via may be used to shorten the transmission path, so as to improve the work efficiency, but the disclosure is not limited to the stacking of wafers to wafers. In some embodiments, hybrid bonding and the through silicon via may also be applied to the stacking of chips to chips or the stacking of chips to wafers.

Hereinafter, other embodiments are described as examples for illustration. It is noted that some of the reference numerals and descriptions of the above embodiment will apply to the following embodiments. The same reference numerals will represent the same or similar components and the descriptions of the same technical contents will be omitted. Reference may be made to the above embodiment for the omitted descriptions, which will not be repeated in the following embodiments.

Figure 7:
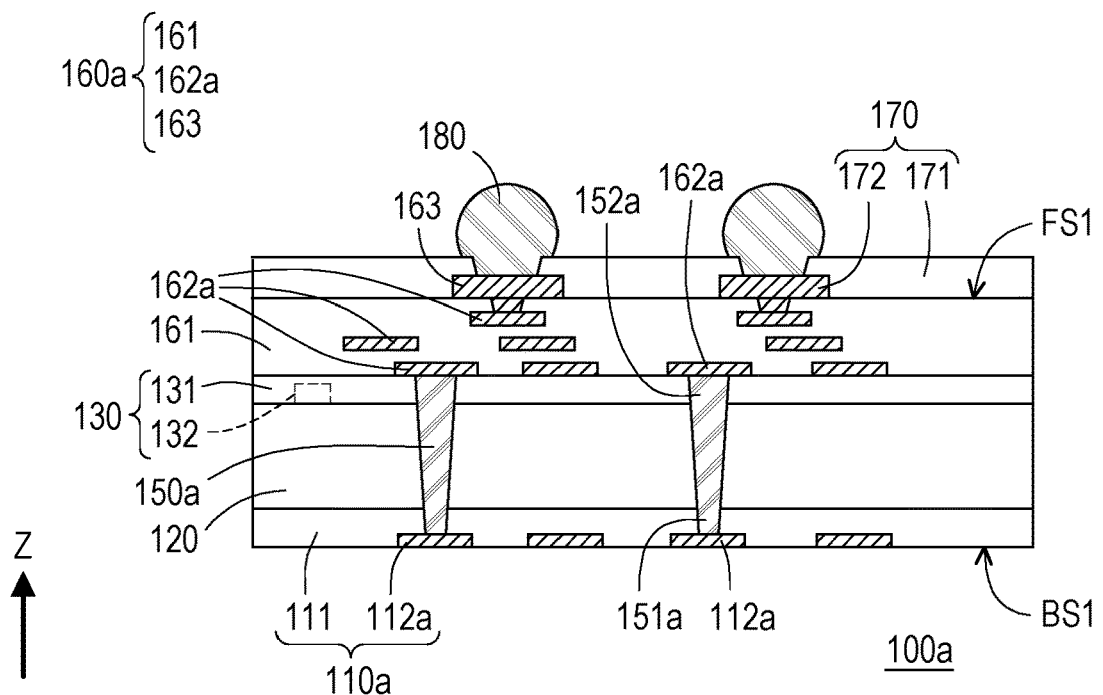
FIG. 7 is a schematic cross-sectional view of a first wafer of the semiconductor package structure of FIG. 6.

FIG. 6 is a schematic cross-sectional view of a semiconductor package structure according to another embodiment of the disclosure. FIG. 7 is a schematic cross-sectional view of a first wafer of the semiconductor package structure of FIG. 6. Referring to FIGS. 1, 2, 6, and 7 together, a semiconductor package structure 20 of this embodiment is similar to the semiconductor package structure 10 of FIG. 1, and a first wafer 100a of this embodiment is similar to the first wafer 100 of FIG. 2. However, a main difference between the two is that in the semiconductor package structure 20 of this embodiment, the second wafer 200 and the first wafer 100a are disposed in the face-to-back manner.

Specifically, referring to FIGS. 6 and 7, in this embodiment, the first wafer 100a includes a first bonding structure 110a, the first substrate 120, the element layer 130, a first through silicon via 150a, and a first connecting structure 160a. The first wafer 100a has the front side surface FS1 and the back side surface BS1 opposite to each other. The front side surface FS1 may be a surface of the first connecting structure 160a away from the first substrate 120, and the back side surface BS1 may be a surface of the first bonding structure 110a away from the first substrate 120.

The first bonding structure 110a includes the dielectric layer 111 and a first bonding pad 112a. The first bonding pad 112a is embedded in the dielectric layer 111 and exposed to the back side surface BS1. The first substrate 120 is disposed on the first bonding structure 110a. The element layer 130 is disposed on the first substrate 120. The element layer 130 includes the dielectric layer 131 and the semiconductor device 132. The semiconductor device 132 may include the active device and/or the passive device, such as transistors, diodes, capacitors, resistors, and inductors, etc.

The first connecting structure 160a is disposed on the first substrate 120 and the element layer 130. The first connecting structure 160a may be electrically connected to the semiconductor device 132 of the element layer 130. The first connecting structure 160a includes the dielectric layer 161 and multilayer first connecting pads 162a. The multilayer first connecting pads 162a are disposed in the dielectric layer 161. The dielectric layer 161 has an opening to expose the first connecting pads 162a of the multilayer first connecting pads 162a away from the first substrate 120.

The first through silicon via 150a may penetrate through the first substrate 120, the dielectric layer 131 of the element layer 130, and a part of the dielectric layer 111 of the first bonding structure 110a. The first through silicon via 150a has two opposite ends 151a and 152a. The end 151a may be in direct contact with the first bonding pad 112a of the first bonding structure 110a, and the end 152a may be in direct contact with the first connecting pad 162a of the first connecting structure 160a adjacent to the first substrate 120.

In addition, in this embodiment, the first wafer 100a may further include the redistribution layer 170 and the conductive terminal 180. The redistribution layer 170 is disposed on the front side surface FS1, and the redistribution layer 170 may include the dielectric layer 171 and the pad 172. The pad 172 is disposed on the front side surface FS1, and may be electrically connected to the first connecting pad 162a of the first connecting structure 160a away from the first substrate 120 through a conductive via 163 of the first connecting structure 160a. The dielectric layer 171 has the opening to expose the pad 172. The conductive terminal 180 is disposed in the opening of the dielectric layer 171 to be electrically connected to the pad 172. The conductive terminal 180 may be configured to be bonded to the circuit board (not shown), but the disclosure is not limited thereto.

In this embodiment, the second connecting pad 262 of the second connecting structure 260 in the second wafer 200 may be in direct contact with the first bonding pad 112a of the first bonding structure 110a in the first wafer 100a. That is to say, the front side surface FS2 of the second wafer 200 may face the back side surface BS1 of the first wafer 100a, so that the second wafer 200 and the first wafer 100a are disposed in the face-to-back manner.

Figure 8:
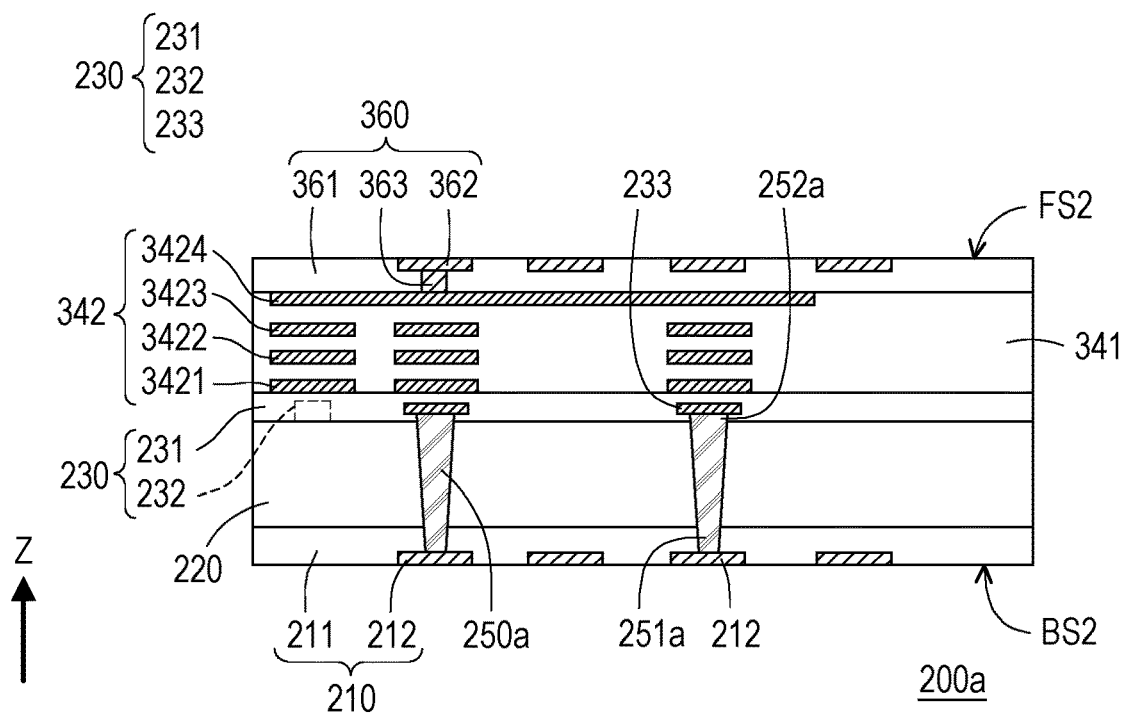
FIG. 8 is a schematic cross-sectional view of a second wafer of a semiconductor package structure according to another embodiment of the disclosure.

FIG. 8 is a schematic cross-sectional view of a second wafer of a semiconductor package structure according to another embodiment of the disclosure. Referring to both FIGS. 3 and 8, a second wafer 200a of this embodiment is similar to the second wafer 200 of FIG. 3. However, a main difference between the two is that in the second wafer 200a of this embodiment, the element layer 230 further includes a patterned circuit layer 233.

Specifically, referring to FIG. 8, the patterned circuit layer 233 is disposed on the dielectric layer 231, and the patterned circuit layer 233 may be electrically connected to the semiconductor device 232. A second through silicon via 250a may penetrate through the second substrate 220, a part of the dielectric layer 231 of the element layer 230, and a part of the dielectric layer 211 of the second bonding structure 210. An end 251a of the second through silicon via 250a may be in direct contact with the second bonding pad 212 of the second bonding structure 210, and an end 252a of the second through silicon via 250a may be in direct contact with the patterned circuit layer 233 of the element layer 230.

In some embodiments, the patterned circuit layer (not shown) may also be disposed in the element layer of the third wafer, so that two ends of the third through silicon via of the third wafer may be in direct contact with the third bonding pad of the third bonding structure and the patterned circuit layer of the element layer, respectively.

FIG. 9 is a schematic cross-sectional view of a semiconductor package structure according to another embodiment of the disclosure. Referring to both FIGS. 6 and 9, a semiconductor package structure 30 of this embodiment is similar to the semiconductor package structure 20 of FIG. 6. However, a main difference between the two is that in the semiconductor package structure 30 of this embodiment, one fourth through silicon via 155 is used to replace the first through silicon via 150a and the second through silicon via 250 in FIG. 6, and one fifth through silicon via 355 is used to replace the two third through silicon vias 350 in FIG. 6.

Specifically, referring to FIG. 9, in this embodiment, after the front side surface FS2 of the second wafer 200 is bonded to the back side surface BS1 of the first wafer 100a, the fourth through silicon via 155 is formed to form the control unit 10a. The fourth through silicon via 155 may penetrate through a part of the dielectric layer 161 of a first connecting structure 160b of the first wafer 100a, the dielectric layer 131 of the element layer 130, the first substrate 120, and the dielectric layer 111, and the fourth through silicon via 155 may further extend and penetrate through the dielectric layer 241 of the second interconnection layer 240 of the wafer 200, the dielectric layer 231 of the element layer 230, the second substrate 220, and a part of the dielectric layer 211 of the second bonding structure 210. The fourth through silicon via 155 has two opposite ends 1551 and 1552. The end 1551 may be in direct contact with the second bonding pad 212 of the second bonding structure 210, and the end 1552 may be in direct contact with a first connecting pad 162b of the first connecting structure 160b away from the second wafer 200. With this design, the first bonding pad 112a and the second connecting pad 262 in FIG. 6 may be omitted, so as to further shorten a transmission path between the first wafer 100a and the second wafer 200 in the control unit 10a and reduce the power consumption, thereby having the effect of improving the work efficiency.

In this embodiment, after the front side surface FS3 of the third wafer 300a is bonded to the back side surface BS3 of the third wafer 300, and the front side surface FS4 of the fourth wafer 400 is bonded to the back side surface BS3 of the third wafer 300a, the fifth through silicon via 355 is formed to form the memory unit 10b. The fifth through silicon via 355 may penetrate through the dielectric layer 341 of the third interconnection layer 340 of the third wafer 300, the dielectric layer 331 of the element layer 330, the third substrate 320, and the dielectric layer 311. The fifth through silicon via 355 may further extend and penetrate through the dielectric layer 341 of the third interconnection layer 340 of the third wafer 300a, the dielectric layer 331 of the element layer 330, the third substrate 320, and the dielectric layer 311, and the fifth through silicon via 355 may further extend and penetrate through a part of the dielectric layer 441 of the fourth interconnection layer 440 of the fourth wafer 400.

In this embodiment, the fifth through silicon via 355 has two opposite ends 3551 and 3552. The end 3551 may be in direct contact with the fourth metallization pattern 442 of the fourth interconnection layer 440 adjacent to the third wafer 300a, and the end 3552 may be in direct contact with the third connecting pad 362 of the third connecting structure 360 of the third wafer 300. With this design, the third bonding pad 312 of the third wafer 300 and the third connecting pad 362 of the third wafer 300a in FIG. 6 may be omitted, so as to further shorten a transmission path between the third wafer 300, the third wafer 300a, and the fourth wafer 400 in the memory unit 10b and reduce the power consumption, thereby having the effect of improving the work efficiency.

In this embodiment, after the control unit 10a and the memory unit 10b are formed, the third connecting pad 362 of the third wafer 300 is directly bonded to the second bonding pad 212 of the second wafer 200 by hybrid bonding, so that the memory unit 10b is directly bonded to the second wafer 200 of the control unit 10a, and the memory unit 10b may overlap the control unit 10a in the normal direction Z of the semiconductor package structure 10. So far, the semiconductor package structure 30 of this embodiment has been substantially manufactured.

Based on the above, in the semiconductor package structure and the manufacturing method thereof according to the embodiments of the disclosure, by disposing the memory unit on the control unit in a vertically stacked manner, the transmission path between the memory unit and the control unit may be shortened. As a result, the overall work efficiency may be improved. By directly transmitting the signal between the metallization pattern of the second interconnection layer and the second bonding pad of the second bonding structure through the second through silicon via, the redistribution layer is not required to be additionally disposed for the signal transmission between the metallization pattern of the second interconnection layer and the second bonding pad of the second bonding structure. As a result, the transmission path may be shortened, and the work efficiency may be improved. By directly transmitting the signal between the metallization pattern of the third interconnection layer and the third bonding pad of the third bonding structure through the third through silicon via, the redistribution layer is not required to be additionally disposed for the signal transmission between the metallization pattern of the third interconnection layer and the third bonding pad of the third bonding structure. As a result, the transmission path may be shortened, and the work efficiency may be improved.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A semiconductor package structure, comprising:
a control unit comprising a first wafer and a second wafer that are vertically stacked; and
a memory unit disposed on the second wafer of the control unit and comprising a plurality of third wafers and a fourth wafer that are vertically stacked,
wherein the memory unit overlaps the control unit in a normal direction of the semiconductor package structure,
wherein the first wafer comprises:
a first bonding structure comprising a first bonding pad;
a first substrate disposed on the first bonding structure;
a first through silicon via penetrating through the first substrate; and
a first connecting structure disposed on the first substrate and comprising a multilayer first connecting pad,
wherein two opposite ends of the first through silicon via are in direct contact with the first bonding pad and the first connecting pad of the first connecting structure adjacent to the first substrate, respectively.

2. The semiconductor package structure according to claim 1, wherein the second wafer comprises:
a second bonding structure comprising a second bonding pad;
a second substrate disposed on the second bonding structure;
a second interconnection layer disposed on the second substrate and comprising a multilayer second metallization pattern;
a second through silicon via penetrating through the second substrate; and
a second connecting structure disposed on the second interconnection layer and comprising a second connecting pad,
wherein two opposite ends of the second through silicon via are in direct contact with the second bonding pad and one of layers of the multilayer second metallization pattern, respectively.

3. The semiconductor package structure according to claim 2, wherein the first connecting pad of the first wafer away from the first substrate is in direct contact with the second connecting pad of the second wafer.

4. The semiconductor package structure according to claim 2, wherein the third wafer comprises:
a third bonding structure comprising a third bonding pad;
a third substrate disposed on the third bonding structure;
a third interconnection layer disposed on the third substrate and comprising a multilayer third metallization pattern;
a third through silicon via penetrating through the third substrate; and
a third connecting structure disposed on the third interconnection layer and comprising a third connecting pad,
wherein two opposite ends of the third through silicon via are in direct contact with the third bonding pad and one of layers of the multilayer third metallization pattern, respectively.

5. The semiconductor package structure according to claim 2, wherein the fourth wafer comprises:
a fourth substrate;
a fourth interconnection layer disposed on the fourth substrate and comprising a multilayer fourth metallization pattern; and
a fourth connecting structure disposed on the fourth interconnection layer and comprising a fourth connecting pad,
wherein the third bonding pad of the third wafer away from the control unit is in direct contact with the fourth connecting pad of the fourth wafer.

6. The semiconductor package structure according to claim 4, wherein the second bonding pad of the second wafer is in direct contact with the third connecting pad of one of the third wafers.

7. The semiconductor package structure according to claim 1, wherein the first wafer is a system on chip, the second wafer is a logic chip, and the third wafers and the fourth wafer are memory chips.

8. A manufacturing method of a semiconductor package structure, comprising:
forming a control unit, wherein the control unit comprises a first wafer and a second wafer that are vertically stacked, and the first wafer comprises:
a first bonding structure comprising a first bonding pad;
a first substrate disposed on the first bonding structure;
a first through silicon via penetrating through the first substrate; and
a first connecting structure disposed on the first substrate and comprising a multilayer first connecting pad,
wherein two opposite ends of the first through silicon via are in direct contact with the first bonding pad and the first connecting pad of the first connecting structure adjacent to the first substrate, respectively;

forming a memory unit, wherein the memory unit comprises a plurality of third wafers and a fourth wafer that are vertically stacked; and bonding the memory unit to the second wafer of the control unit, so that the memory unit overlaps the control unit in a normal direction of the semiconductor package structure.

9. The manufacturing method of the semiconductor package structure according to claim 8, wherein forming the control unit comprises:

directly bonding a second connecting pad of the second wafer to the first connecting pad of the first wafer away from the first substrate.

10. The manufacturing method of the semiconductor package structure according to claim 8, wherein forming the memory unit comprises:

directly bonding a third connecting pad of one of the third wafers to a third bonding pad of another one of the third wafers; and directly bonding a fourth connecting pad of the fourth wafer to the third bonding pad of the third wafer away from the control unit.

11. The manufacturing method of the semiconductor package structure according to claim 8, wherein a third connecting pad of one of the third wafers is directly bonded to a second bonding pad of the second wafer.

* * * * *